United States Patent
Cannon et al.

(10) Patent No.: US 8,138,573 B2
(45) Date of Patent: Mar. 20, 2012

(54) ON-CHIP HEATER AND METHODS FOR FABRICATION THEREOF AND USE THEREOF

(75) Inventors: Ethan H. Cannon, Sammamish, WA (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/766,342

(22) Filed: Apr. 23, 2010

(65) Prior Publication Data

US 2010/0200953 A1 Aug. 12, 2010

Related U.S. Application Data

(62) Division of application No. 11/419,341, filed on May 19, 2006, now Pat. No. 7,704,847.

(51) Int. Cl.
*H01L 31/115* (2006.01)

(52) U.S. Cl. ......... 257/538; 257/E21.329; 257/E21.331; 438/798

(58) Field of Classification Search .......... 257/536–538, 257/E21.328, E21.329, E21.33, E21.331, 257/E27.047; 438/795–799
See application file for complete search history.

(56) References Cited

U.S. PATENT DOCUMENTS

| | | |
|---|---|---|
| 3,953,264 A | 4/1976 | Wu |
| 4,497,998 A | 2/1985 | West |
| 5,334,829 A | 8/1994 | Ueno et al. |
| 5,369,245 A | 11/1994 | Pickering |
| 5,539,186 A | 7/1996 | Abrami et al. |
| 5,898,706 A | 4/1999 | Dufresne et al. |
| 6,326,634 B1 | 12/2001 | Robinson |
| 6,531,911 B1 | 3/2003 | Hsu et al. |
| 7,064,414 B2 | 6/2006 | Aitken et al. |
| 7,375,371 B2 | 5/2008 | La Rosa et al. |
| 7,484,886 B2 | 2/2009 | Clark et al. |
| 2003/0116552 A1 | 6/2003 | Santoruvo et al. |
| 2003/0119289 A1 | 6/2003 | Bryant |
| 2005/0030149 A1 | 2/2005 | Adkisson et al. |
| 2005/0224849 A1 | 10/2005 | Isenberger et al. |
| 2006/0103007 A1 | 5/2006 | Aitken et al. |

OTHER PUBLICATIONS

Kelleher, et al., "Investigation of On-chip High Temperature Annealing of PMOS Dosimeters", *IEEE Trans on Nuclear Science*, vol. 43(3), Jun. 1996, pp. 997-1001.
Chabrerie, et al., "A New Integrated Test Structure for *on-chip* Post Irradiation Annealing in MOS Devices", *IEEE Trans on Nuclear Science*, 45, 1438 (1998), pp. 228-233.
Takahiro, et al., English language Patent Abstract of Japanese Patent No. 60-055654, dated Mar. 30, 1985.

*Primary Examiner* — Anh Phung
*Assistant Examiner* — Michael Lulis
(74) *Attorney, Agent, or Firm* — Scully, Scott, Murphy & Presser, P.C.; Richard Kotulak, Esq.

(57) ABSTRACT

An on-chip heater and methods for fabrication thereof and use thereof provide that the heater is located within an isolation region that in turn is located within a semiconductor substrate. The heater has a thermal output capable or raising the semiconductor substrate to a temperature of at least about 200° C. The heater may be used for thermally annealing trapped charges within dielectric layers within the semiconductor structure.

16 Claims, 6 Drawing Sheets

ON-CHIP HEATER AND METHODS FOR FABRICATION THEREOF AND USE THEREOF

RELATED APPLICATIONS

This application is a divisional of U.S. patent application Ser. No. 11/419,341, filed May 19, 2006 the entire content and disclosure of which is incorporated herein by reference.

BACKGROUND

1. Field of the Invention

The invention relates generally to trapped charge within semiconductor devices. More particularly, the invention relates to structures and methods for dissipating trapped charge within semiconductor devices.

2. Description of the Related Art

Semiconductor circuits, including CMOS circuits, are often susceptible to ionizing radiation that may lead to trapped charge within layers such as dielectric layers. Trapped charge in a gate dielectric may cause changes in field effect transistor operating parameters, such as a threshold voltage shift. Threshold voltage shifts large enough in magnitude can lead to inoperability of a field effect transistor since a gate may no longer effectively control a channel, due to the presence of trapped charge.

In addition, trapped charge within a dielectric isolation region may make operative a sidewall device or otherwise create a leakage pathway between devices within a semiconductor structure.

Thermal annealing heaters and thermal annealing methods are known in the art to dissipate trapped charge within dielectric layers. Examples include: (1) Kelleher et al., in "Investigation of On-chip High Temperature Annealing of PMOS Dosimeters," IEEE Trans on Nuclear Science, Vol. 43(3), June 1996, pp. 997-1001 (a polysilicon resistor that surrounds a radiation sensitive field effect transistor (RADFET)); (2) Chabrerie et al., in "A New Integrated Test Structure for on-chip Post Irradiation Annealing in MOS Devices," IEEE Trans on Nuclear Science, 45, 1438 (1998) (on chip heating for trapped charge dissipation within the context of silicon-on-insulator technology); and (3) Takahiro et al., Patent Abstracts of Japan No. 60-055654 (radiation resistance of an integrated circuit effected using a heat generating circuit).

Semiconductor structure dimensions are certain to continue to decrease. As a result thereof, consideration of trapped charge generation and control within semiconductor devices is also likely of considerable importance. To that end, structures and methods for trapped charge dissipation within semiconductor structures are desirable.

SUMMARY

The invention comprises a semiconductor structure that includes a heater, as well as a method for fabricating the semiconductor structure and a method for dissipating trapped charge within the semiconductor structure while using the heater. The heater is intended to thermally anneal other portions of the semiconductor structure, to remove trapped charge within semiconductor devices, and in particular to remove trapped charge within oxide and other dielectric layers within the semiconductor structure and semiconductor devices. The invention is generally applicable within semiconductor fabrication. The invention is also applicable for a semiconductor structure and semiconductor devices subject to extraterrestrial applications, where enhanced levels of ionizing radiation are present and enhanced levels of charge may be trapped within semiconductor structures.

A structure in accordance with the invention includes at least one isolation region located within a semiconductor substrate. The structure also includes at least one heater located embedded within the at least one isolation region.

A method for fabricating a semiconductor structure in accordance with the invention includes forming at least one isolation region located within a semiconductor substrate. This particular method also includes forming at least one heater located embedded within the at least one isolation region.

A method for dissipating a charge within a semiconductor structure in accordance with the invention includes exposing a semiconductor structure to ionizing radiation having an energy that provides for generating a trapped charge within the semiconductor structure. This particular method also includes thermally annealing the trapped charge to neutralize the trapped charge. Within this particular method, the thermal annealing is undertaken using at least one heater located embedded within at least one isolation region within the semiconductor structure.

DESCRIPTION OF THE SEVERAL VIEWS OF THE DRAWINGS

The objects, features and advantages of the invention are understood within the context of the Description of the Preferred Embodiment as set forth below. The Description of the Preferred Embodiment is understood within the context of the accompanying drawings, that form a material part of this disclosure, wherein.

DETAILED DESCRIPTION

The invention, which comprises a semiconductor structure comprising a heater for thermally annealing and reducing trapped charge within a semiconductor device within the semiconductor structure, is described in further detail below within the context of drawings described above. The drawings are intended for illustrative purposes, and to that end they are not necessarily drawn to scale.

Figure 1:
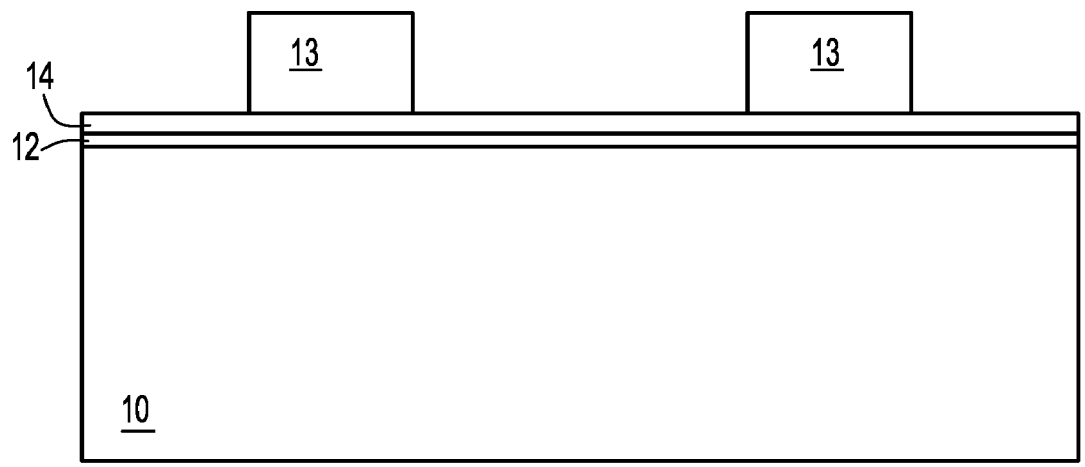
FIG. 1 to FIG. 11 show a series of schematic cross-sectional diagrams illustrating the results of progressive stages in fabricating a semiconductor structure having incorporated therein a heater in accordance with an embodiment of the invention.

FIG. 1 to FIG. 11 show a series of schematic cross-sectional diagrams illustrating the results of progressive stages in fabricating a semiconductor structure in accordance with a preferred embodiment of the invention. FIG. 1 shows a schematic cross-sectional diagram of the semiconductor structure at an early stage in fabrication thereof in accordance with the embodiment.

FIG. 1 shows a semiconductor substrate 10. Successively layered and located upon or over the semiconductor substrate 10 are a pad dielectric 12, a hard mask 14 located upon the pad dielectric 12 and first photoresist layers 13 located upon the hard mask 14.

Each of the foregoing semiconductor substrate 10 and layers 12/14/13 may comprise materials and have dimensions that are conventional in the semiconductor fabrication art.

Each of the foregoing semiconductor substrate 10 and layers 12/14/13 may also be formed using methods that are conventional in the semiconductor fabrication art.

The semiconductor substrate 10 comprises a semiconductor material. Non-limiting examples of semiconductor materials include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The semiconductor substrate 10 may comprise a bulk semiconductor substrate. Alternatively, the semiconductor substrate may comprise a semiconductor-on-insulator substrate or a hybrid orientation substrate. A semiconductor-on-insulator substrate comprises a base semiconductor substrate, a buried dielectric layer located thereupon and a surface semiconductor layer located further thereupon. A hybrid orientation substrate comprises and includes multiple semiconductor layers of different crystallographic orientation.

Semiconductor-on-insulator substrates and hybrid orientation substrates may be fabricated using any of several methods. Lamination methods, layer transfer methods and separation by implantation of oxygen (SIMOX) methods are common methods.

The pad dielectric 12 comprises a pad dielectric material intended as a stress reducing material interposed between the semiconductor substrate 10 and a material from which is comprised the hard mask 14. Such pad dielectric materials typically comprise silicon oxide materials, although the invention is not specifically limited to a pad dielectric material comprised of a silicon oxide material. Oxides of other elements may also be used for pad dielectric materials. Pad dielectric materials may be formed using any of several methods. Non-limiting examples include thermal or plasma oxidation or nitridation methods, chemical vapor deposition methods and physical vapor deposition methods. Typically, the pad dielectric 12 comprises a thermal silicon oxide pad dielectric material that has a thickness from about 10 to about 50 angstroms.

The hard mask 14 comprises a hard mask material. Hard mask materials generally comprise nitrides and oxynitrides of silicon. Oxynitrides and nitrides of other elements are not excluded. Also included are semiconductor hard mask materials and conductor hard mask materials. Hard mask materials may in general be formed using methods analogous, equivalent or identical to the methods used for forming the pad dielectric 12. Typically, the hard mask 14 comprises a silicon nitride material having a thickness from about 50 to about 100 angstroms.

The first photoresist layers 13 may comprise any of several photoresist materials. Non-limiting examples include positive photoresist materials, negative photoresist materials and hybrid photoresist materials. The first photoresist layers 13 are formed using generally conventional methods. Typically, these include spin coating, selective photoexposure and development methods. Typically, each of the first photoresist layers 13 has a thickness from about 5000 to about 10000 angstroms.

Figure 2:
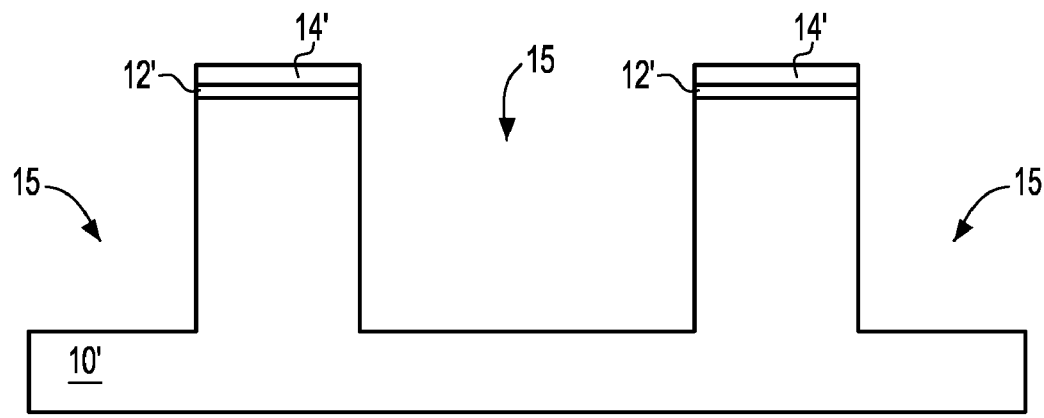

FIG. 2 shows the results of sequentially etching the hard mask 14, the pad dielectric 12 and the semiconductor substrate 10 to form the hard masks 14', pad dielectrics 12' and semiconductor substrate 10'. At least the first photoresist layers 13 are used as a mask for etching the hard mask 14 to form the hard masks 14'. At least the hard masks 14' are used for etching the pad dielectric 12 and the semiconductor substrate 10 to form the pad dielectrics 12' and the semiconductor substrate 10'. The foregoing etching will typically use a fluorine containing etchant gas composition for etching the hard mask 14 and the pad dielectric 12 (when each of the hard mask 14 and the pad dielectric 12 comprises a silicon containing dielectric material), and a chlorine containing etchant gas composition for etching the semiconductor substrate 10 to form the semiconductor substrate 10'.

Resulting from the foregoing etching are isolation trenches 15. The isolation trenches 15 have a depth within the semiconductor substrate 10' from about 2000 to about 6000 angstroms.

Figure 3:
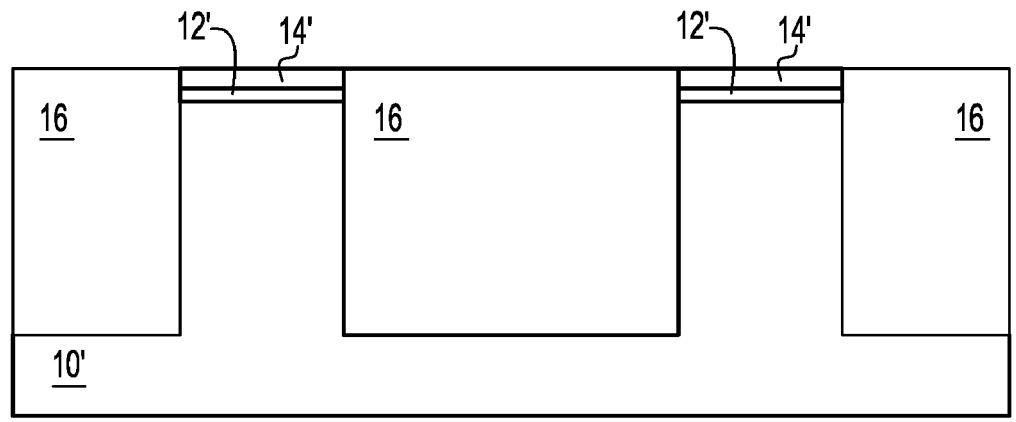

FIG. 3 shows the results of backfilling the isolation trenches 15 within the semiconductor substrate 10' that is illustrated within FIG. 2 with isolation regions 16. The isolation regions 16 comprise isolation materials. Oxides, nitrides and oxynitrides of silicon are common isolation materials. Oxides, nitrides and oxynitrides of other elements are not excluded. The embodiment and the invention also contemplate that isolation regions 16 may comprise laminates, aggregates and composites of isolation materials. Typically, the isolation regions 16 comprise laminates of silicon oxide and silicon nitride isolation materials.

Figure 4:
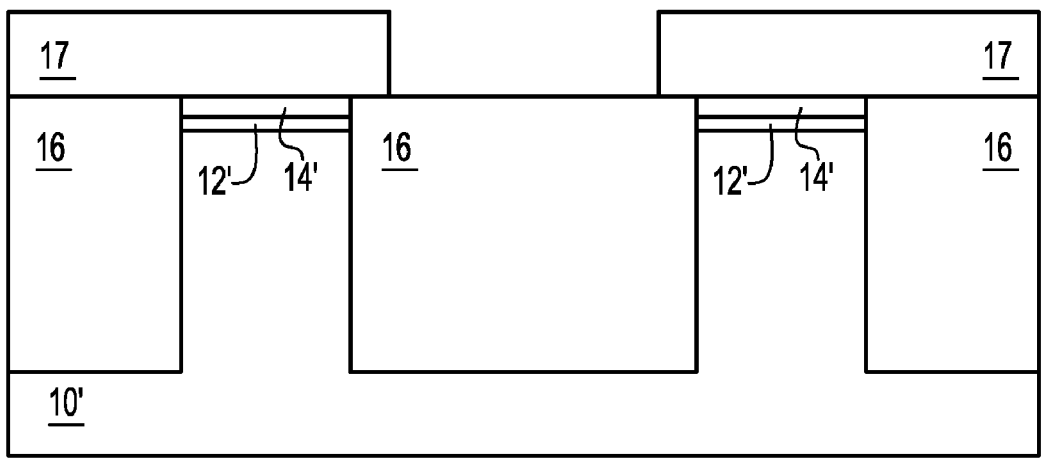

FIG. 4 shows second photoresist layers 17 located upon the semiconductor structure of FIG. 3. The second photoresist layers 17 leave exposed a center portion of the central isolation region 16. The pair of second photoresist layers 17 may be formed using photoresist materials that are analogous, equivalent or identical to the photoresist materials that are used for forming the first photoresist layers 13.

Figure 5:
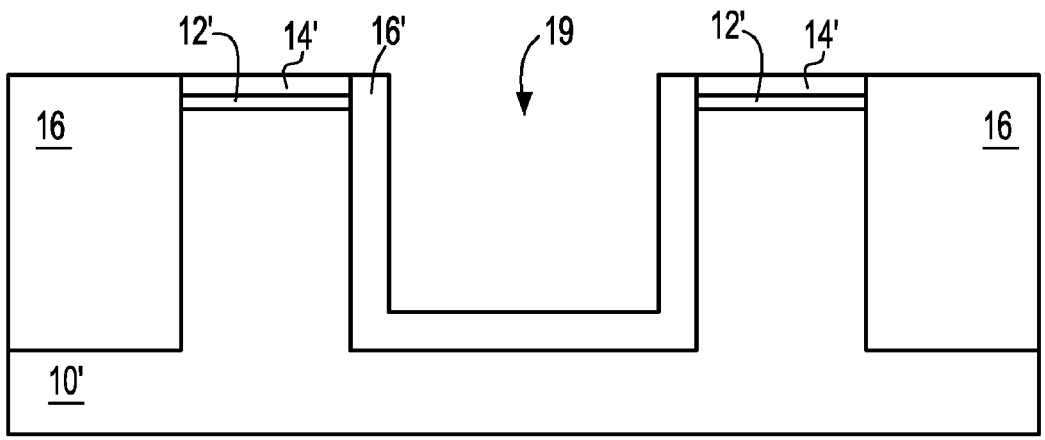

FIG. 5 shows the results of etching a trench 19 within the portion of the central isolation region 16 exposed by the photoresist layers 17. FIG. 5 also shows the results of stripping the pair of second photoresist layers 17 from the semiconductor structure of FIG. 4 after etching the trench 19. Etching of the trench 19 may be effected while typically using a fluorine containing plasma etch method. Under certain circumstances, wet chemical etchants may also be used. Typically, the etching leaves remaining sidewall and floor portions that yield an isolation region 16'. The sidewall and floor portions that comprise the isolation region 16' have thicknesses from about 500 to about 1000 angstroms.

Figure 6:
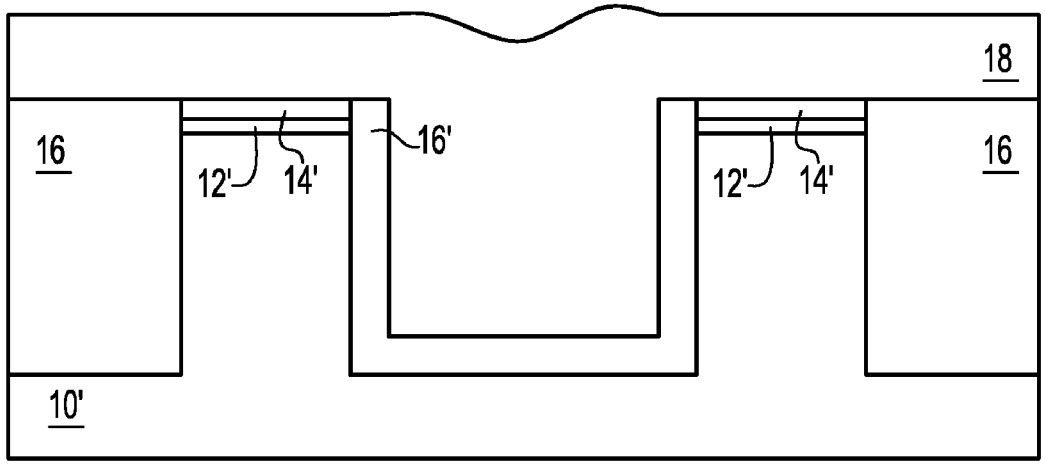

FIG. 6 shows the results of forming a resistive material layer 18 upon the semiconductor structure of FIG. 5, and in particular filling the trench 19. The resistive material layer 18 may comprise any of several resistive materials that allow for adequate heat generation when a portion of the resistive material 18 within the trench 19 is used as a heater that heats the remainder of the semiconductor structure whose schematic cross-sectional diagram is illustrated in FIG. 6. Such resistive materials may include, but are not limited to: polysilicon resistive materials, certain minimally conductive oxide resistive materials and certain low conductivity metal, metal alloy, metal nitride and metal silicide materials. Typically, a bulk resistivity for the resistive materials is desired to be in a range from about 0.001 to about 0.1 Ohm-cm. The resistive material may be deposited using methods including but not limited to: chemical vapor deposition methods (including atomic layer chemical vapor deposition methods) and physical vapor deposition methods (including sputtering methods). Either of the foregoing methods may also include thermal or plasma oxidation or nitridation methods.

Figure 7:
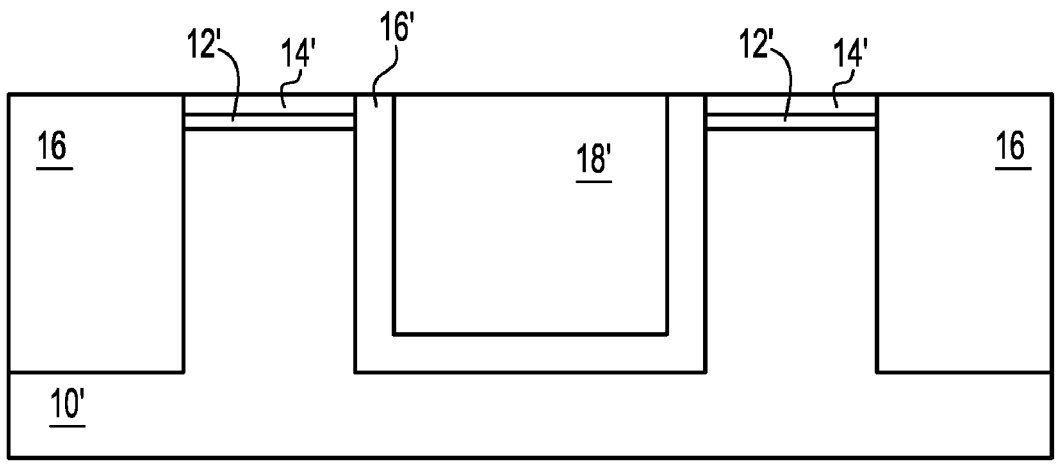
Figure 8:
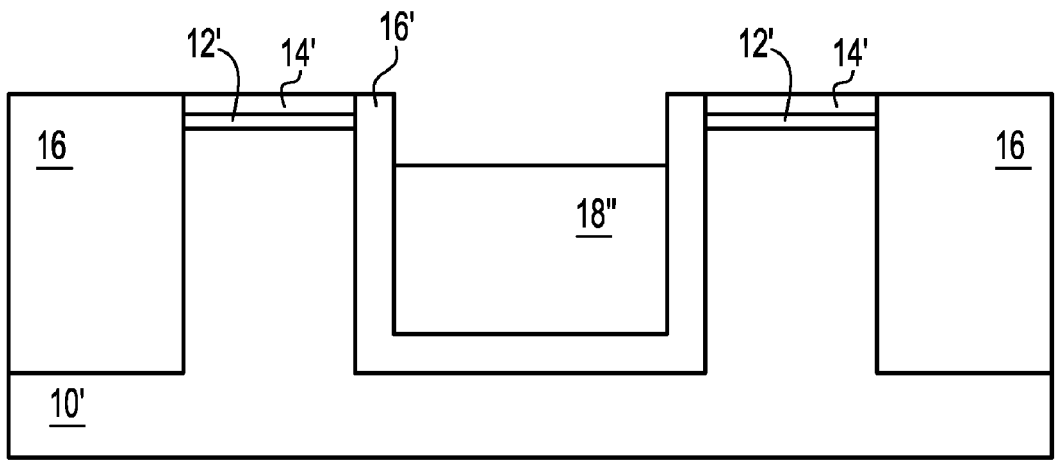

FIG. 7 shows the results of planarizing the resistive material layer 18 to form the resistive material layer 18'. FIG. 8 shows the results of etching back the resistive material layer 18' to form the resistive material layer 18". As is illustrated in FIG. 8, an upper surface of the resistive material layer 18" is lower than an upper surface of the semiconductor substrate 10'.

Planarizing of the resistive material layer 18 to form the resistive material layer 18' may be effected using any of several planarizing methods. Non-limiting examples include purely mechanical polish planarizing methods, as well as chemical mechanical polish planarizing methods. Chemical mechanical polish planarizing methods are generally more common. Chemical mechanical polish planarizing methods are used in several applications beyond the planarizing of the resistive layer 18 to form the resistive layer 18'.

Etching back of the resistive material layer 18' to form the resistive material layer 18" may be effected using either or both of a plasma etch method and a wet chemical etch method. Either of the plasma etch method and the wet chemical etch method uses respectively an etchant gas composition or a wet chemical etchant that is appropriate for the resistive material from which is comprised the resistive material layer 18". For a polysilicon resistive material, a chlorine containing plasma etch method is common. For a polysilicon resistive material, certain acid compositions are also appropriate as etchants.

Figure 9:
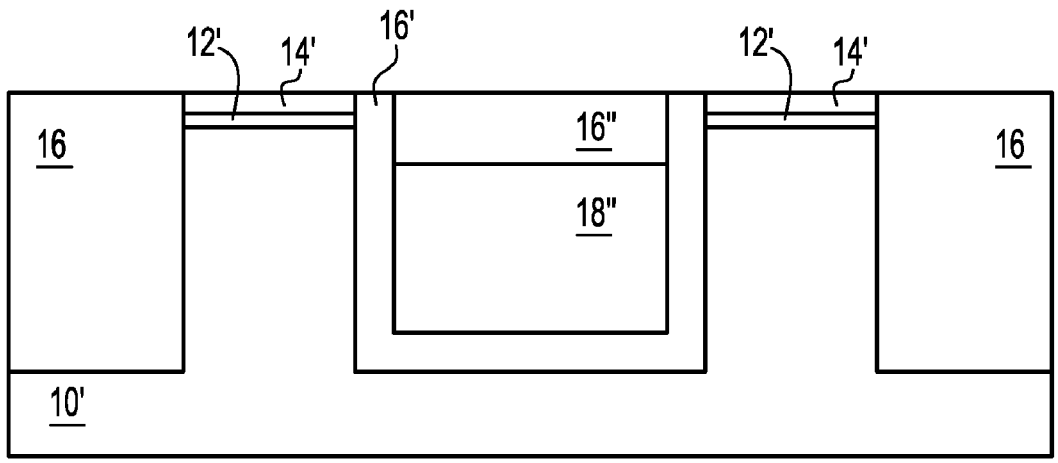

FIG. 9 shows a capping layer 16" that caps the resistive layer 18" that serves as a heater. The capping layer 16" typically comprises the same material as remaining portions of the isolation region 16'. The capping layer 16" is typically initially formed as a blanket layer of a dielectric capping material and subsequently planarized back to form the capping layer 16". Similarly with the planarizing of the resistive layer 18 to form the resistive layer 18', planarizing of the capping layer 16" may also be effected using a purely mechanical planarizing method, or (alternatively and preferably) a chemical mechanical polish planarizing method.

Figure 10:
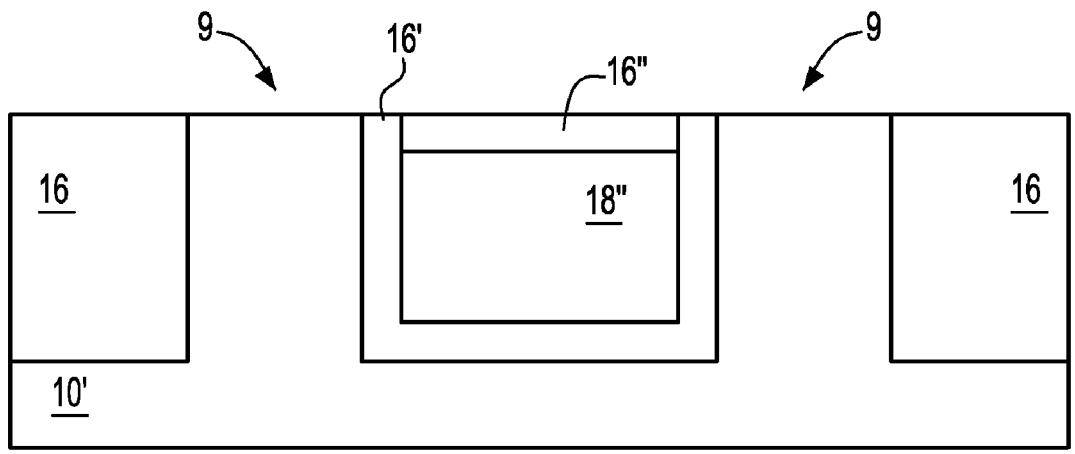

FIG. 10 shows the results of stripping the hard masks 14' from the semiconductor structure of FIG. 9, and subsequently planarizing the remaining structure while using the pair of active regions 9 as a planarizing stop layer. In accordance with previous process steps, the planarizing may be effected using purely mechanical planarizing methods, or alternatively, chemical mechanical polish planarizing methods may also be used.

Figure 11:
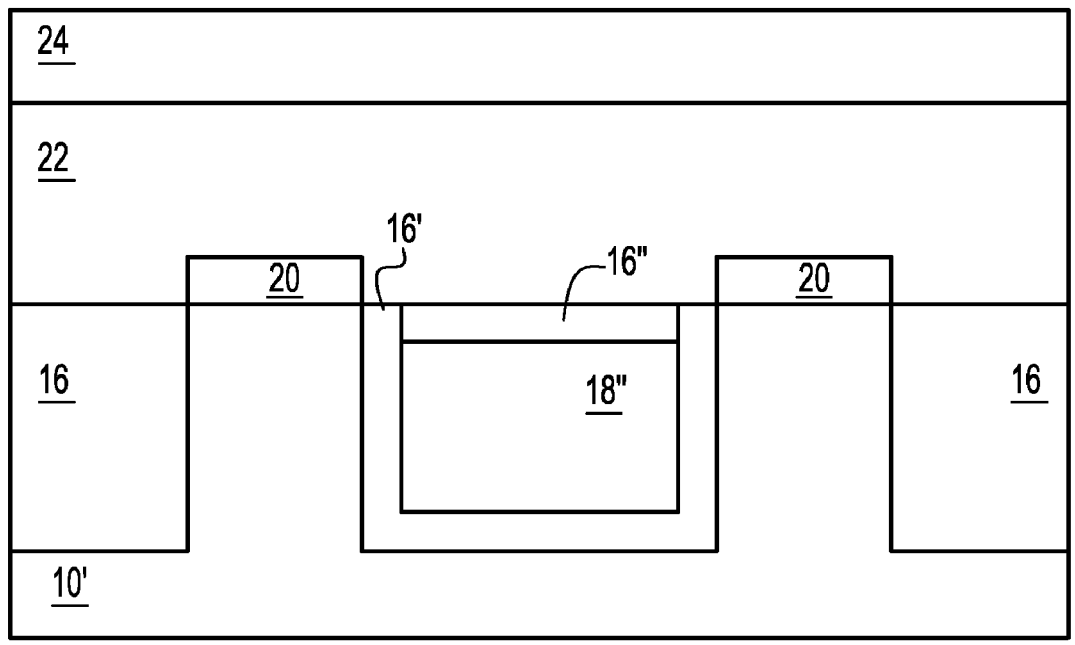

FIG. 11 first shows gate dielectrics 20 located upon active regions 9 of the semiconductor substrate 10'.

Gate dielectrics 20 may comprise generally conventional gate dielectric materials having a dielectric constant from about 4 to about 20, measured in vacuum. Typically, these gate dielectric materials include oxides, nitrides and oxynitrides of silicon. Oxides, nitrides and oxynitrides of other elements are not excluded. Such gate dielectrics may be formed using methods including but not limited to: thermal or plasma oxidation or nitridation methods, chemical vapor deposition methods and physical vapor deposition methods. The gate dielectrics 20 may also comprise generally higher dielectric constant dielectric materials having a dielectric constant from about 20 to at least about 100. Examples of these gate dielectric materials include hafnium oxides, hafnium silicates, lanthanum oxides, titanium oxides, barium-strontium titanates (BSTs) and lead-zirconate titanates (PZTs). The gate dielectrics 20 may be formed using methods appropriate to their materials of composition. The methods may include, but are not limited to: thermal or plasma oxidation or nitridation methods, chemical vapor deposition methods (including atomic layer chemical vapor deposition methods) and physical vapor deposition methods (including sputtering methods). Typically, the gate dielectrics 20 comprise a thermal silicon oxide material having a thickness from about 10 to about 70 angstroms.

FIG. 11 also shows a gate electrode 22 spanning the gate dielectrics 20 and the isolation regions 16, 16', and 16". The gate electrode 22 comprises a gate electrode conductor material. Typical gate electrode conductor materials include certain metals, metal alloys, metal nitrides and metal silicides, as well as polysilicon gate electrode materials. The gate electrode materials may be deposited using methods including but not limited to: plating methods, chemical vapor deposition methods and physical vapor deposition methods. Typically, the gate electrode 22 comprises a polysilicon gate electrode material having a thickness from about 500 to about 2000 angstroms.

Finally, FIG. 11 also shows an interlevel dielectric layer 24. The interlevel dielectric layer 24 comprises a dielectric material. Non-limiting examples of dielectric materials include oxides, nitrides and oxynitrides of silicon. Oxides, nitrides and oxynitrides of other elements are not excluded. Alternatively, examples of other dielectric materials include organic low-k films, porous oxides of silicon, and air gaps. Similarly with other dielectric materials, the interlevel dielectric layer 24 may be formed using methods including but not limited to thermal or plasma oxidation or nitridation methods, chemical vapor deposition methods and physical vapor deposition methods. Typically, the interlevel dielectric layer 24 comprises a silicon oxide material having a thickness from about 2000 to about 7000 angstroms.

FIG. 11 shows a schematic cross-sectional diagram of a semiconductor structure in accordance with a preferred embodiment of the invention. The semiconductor structure comprises a heater 18" that is embedded completely and encapsulated within an isolation region 16'/16". As will be illustrated within the context of additional schematic cross-sectional diagrams to follow, the heater 18" provides for dissipation of trapped charge within various semiconductor structure components and thus provides for efficient operation of the semiconductor structure of FIG. 11.

Figure 12:
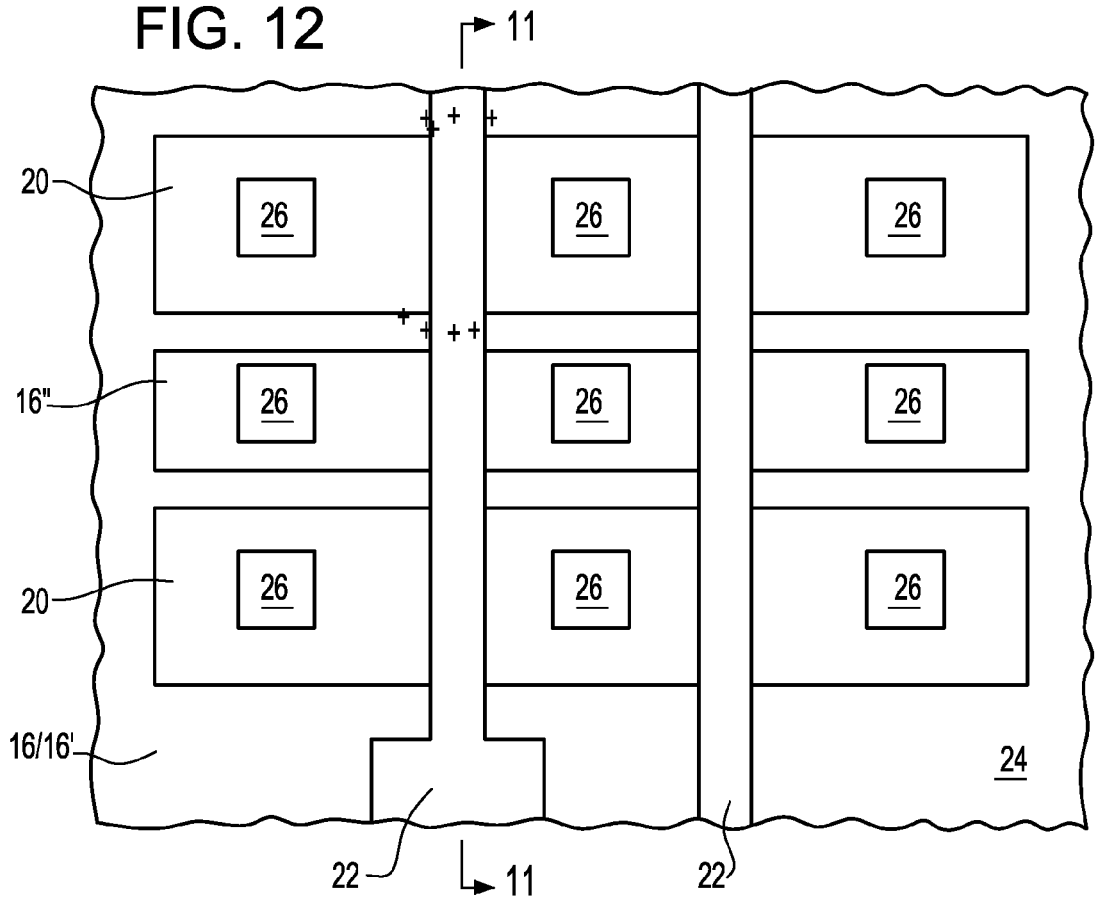
FIG. 12 shows a schematic plan-view diagram corresponding with the schematic cross-sectional diagram of FIG. 11.

FIG. 12 shows a schematic plan-view diagram corresponding with the schematic cross-sectional diagram of FIG. 11.

FIG. 12 shows the interlevel dielectric layer 24. A series of contacts 26 connects to source/drain region portions of the active regions 9 that are covered by gate dielectrics 20. An additional pair of contacts 26 connects to the heater 18 by penetrating through the isolation region 16". Gate electrodes 22 are also illustrated. FIG. 12 thus illustrates that the heater 18 is longitudinally disposed with respect to a pair of mated field effect transistors within the active regions 9 that are covered by the gate dielectrics 20. FIG. 12 finally illustrates leakage pathways (represented by + signs) between source/drain regions that are separated by gate electrode 22.

Figure 13:
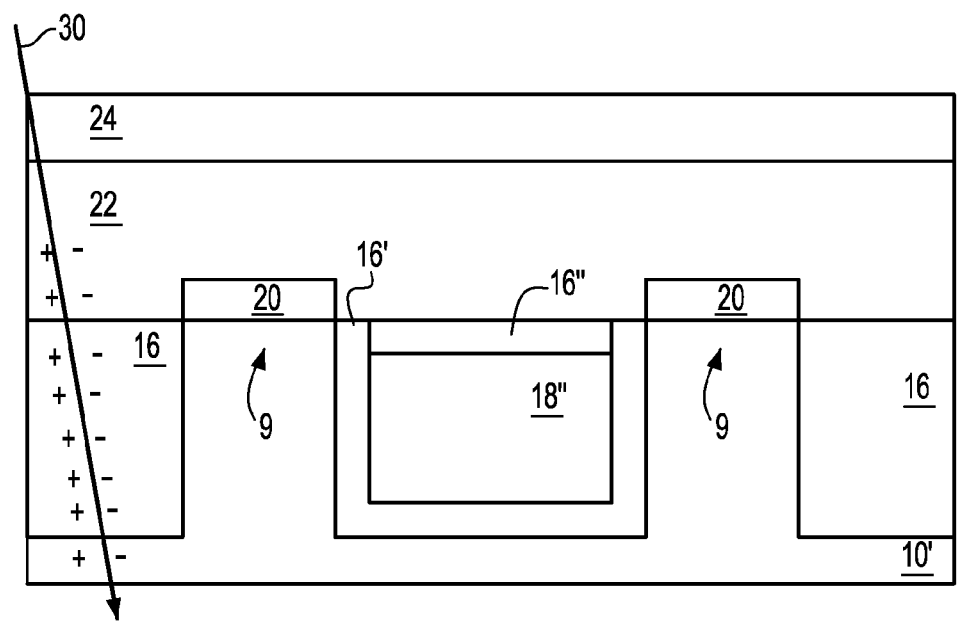
FIG. 13 to FIG. 15 show a series of schematic cross-sectional diagrams illustrating operation of the heater within the semiconductor structure in accordance with FIG. 11.
Figure 14:
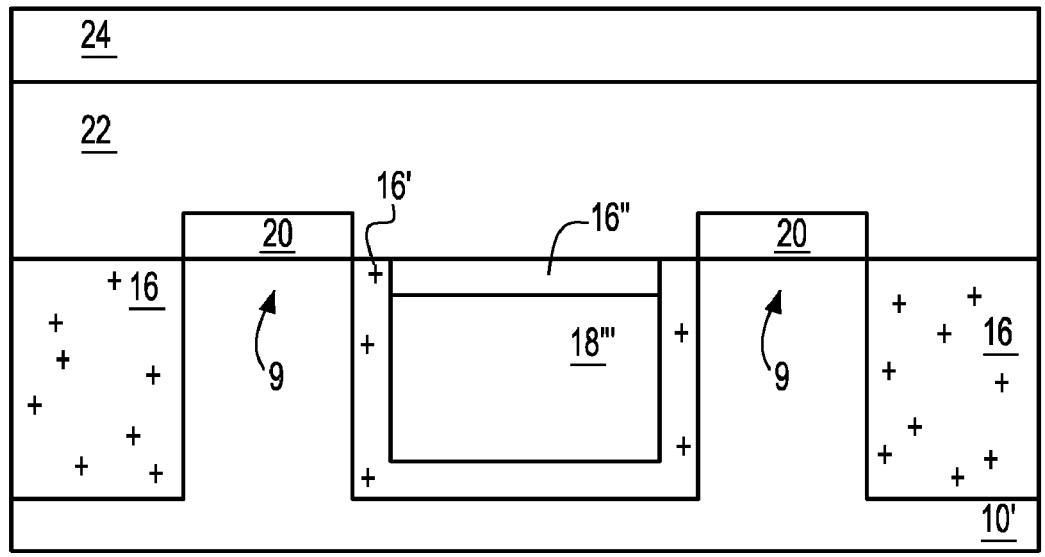
Figure 15:
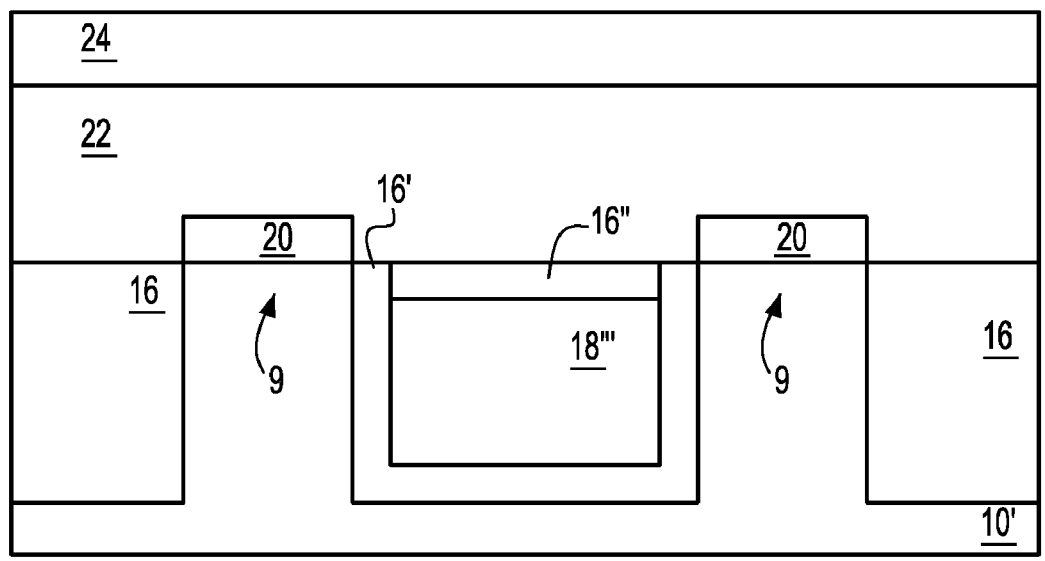

FIG. 13 to FIG. 15 illustrate the results of operation the heater 18" within the semiconductor structure of FIG. 11 or FIG. 12. Operation of the heater 18" provides that that trapped charge generated within the semiconductor structures of FIG. 11 and FIG. 12 may be effectively thermally dissipated.

FIG. 13 first shows an incident ionizing radiation particle 30, which when incident upon the isolation region 16 yields electron-hole pairs. The ionizing radiation particle 30 may comprise a cosmic radiation particle. Alternatively, an alpha particle may also create electron-hole pairs within a dielectric material. Other examples of ionizing radiation include protons and electrons in trapped belts surrounding a planet, and X-rays or gamma-rays. Typical energies for the ionizing radiation particle 30 are in a range from about 1 MeV to greater than 1 GeV. Typical energies for ionizing X-rays and gamma-rays are greater than 10 keV.

As is understood by a person skilled in the art, electrons within the electron-hole pairs are generally mobile. Thus, electrons are able to dissipate charge as they move through dielectric materials to electron sink materials (such as conductor materials) where they may be neutralized. In contrast, however, holes as charge carriers are less mobile and have a greater likelihood to remain static and fixed within a dielectric material. Thus, FIG. 14 illustrates trapped hole charge carriers (as + signs) within each of the isolation regions 16 and 16'/16". FIG. 15 also shows an energized heater 18''' that thermally anneals trapped hole charge carriers from the isolation regions 16/16'/16".

The heater 18" when energized to provide the energized heater 18''' in accordance with the invention can anneal trapped charge with a certain level of efficiency. At a heater temperature of about 200° C., an energized heater 18''' in accordance with the invention can reduce a trapped charge level by a factor of about 2 in a timescale of about 15 minutes. Thus, the invention contemplates a heater having a capacity to raise the temperature of a charged semiconductor structure to at least about 200° C.

The semiconductor structure of FIG. 11 is desirable within extra-terrestrial applications such as space satellite applications and space vehicle applications. Suggestions for operation of a heater 18" within a semiconductor structure in accordance with the invention may include operation of the heater 18" at pre-determined intervals, such as prior to a space explorer reaching a particular planet, in order to anneal charge accumulated during the voyage to the planet. Alternatively, when located within a satellite, a heater 18" within a semiconductor structure in accordance with the invention may be operated periodically, with the period between heater operations set by the rate of charge accumulation. Similarly, it is also plausible within the invention to monitor radiation induced charging for purposes of determining an appropriate time interval for operating a heater 18" within a semiconductor structure in accordance with the invention. Finally, with respect to extra-terrestrial applications, it may also be desirable to utilize redundant circuitry and redundant components each of which has a separate heater 18". It may be desirable to include sufficient redundancy that while the heater is operated on one or more redundant components, the remaining redundant components operate normally such that the semiconductor structure continues to operate, albeit at reduced capacity.

Alternative variations include operation of a heater for a time interval where it is expected that significant trapped charge accumulation will occur, but accumulated trapped charge is not sufficient to impact operation of a charged semiconductor structure. Also contemplated is operation of a heater when the output of a monitor circuit indicates that significant trapped charge accumulation has occurred, but accumulated trapped charge is also not sufficient to impact operation of a charged semiconductor structure. Finally, also contemplated is a semiconductor structure that includes redundant components each of which has a separate heater, and there are adequate redundant components to perform the thermally annealing the trapped charges on one or more redundant component, while the remaining redundant components operate normally such that the semiconductor structure continues to operate.

The preferred embodiment of the invention is illustrative of the invention rather than limiting of the invention. Revisions and modifications may be made to methods, materials, structures and dimensions of a semiconductor structure in accordance with the preferred embodiment of the invention, while still providing an embodiment in accordance with the invention, further in accordance with the accompanying claims.

What is claimed is:

1. A semiconductor structure comprising:
    at least one trench isolation region located within a semiconductor substrate, the at least one trench isolation region comprised of a single dielectric material selected from the group consisting of oxides, nitrides and oxynitrides;
    at least one heater comprised of a resistive polysilicon material located embedded within the at least one trench isolation region, wherein a unitary and U-shaped remaining portion of the single dielectric material of the at least one trench isolation region is present in direct contact with a base and sidewalls of the at least one heater, wherein an upper surface of the at least one heater is below an upper surface of the semiconductor substrate; and
    a capping layer of a dielectric material on the upper surface of the at least one heater, wherein an upper surface of the capping layer is coplanar with an upper surface of the semiconductor substrate.

2. The semiconductor structure of claim 1 wherein the at least one heater has a thermal output sufficient to heat the semiconductor substrate to a temperature of at least about 200° C.

3. The semiconductor structure of claim 1 further comprising at least two contacts to the at least one heater that penetrate through the at least one trench isolation region.

4. A method for neutralizing a charged semiconductor structure comprising:
    forming at least one trench isolation region comprised of a single dielectric material selected from the group consisting of oxides, nitrides and oxynitrides within a semiconductor substrate;
    removing a central portion of the at least one trench isolation region;
    forming a heater composed of resistive polysilicon material on a remaining portion of the trench isolation region, wherein a base surface and sidewall surface of the at least one heater is in direct contact with the remaining portion of the trench isolation region;
    exposing a semiconductor structure to ionizing radiation having an energy that provides for generating a trapped charge within the semiconductor structure; and
    thermally annealing the trapped charge to neutralize the trapped charge, the thermal annealing being undertaken using the at least one heater located embedded within the at least one trench isolation region within a semiconductor substrate, wherein an upper surface of the at least one heater is below an upper surface of the semiconductor substrate.

5. The method of claim 4 wherein the exposing the semiconductor structure to ionizing radiation uses ionizing radiation selected from the group consisting of cosmic radiation, alpha radiation, protons and electrons in trapped particle belts, X-rays and gamma-rays.

6. The method of claim 4 wherein the thermal annealing is undertaken at a temperature of at least about 200° C.

7. The method of claim 4 wherein the exposing the semiconductor structure includes exposing the semiconductor structure to provide a trapped charge within a dielectric layer within the semiconductor structure.

8. The method of claim 4 wherein the thermal annealing the trapped charge comprises thermal annealing after an arbitrary time interval projected for a trapped charge to accumulate, where the trapped charge is insufficient to impact operation of the charged semiconductor structure.

9. The method of claim 4 wherein the thermal annealing the trapped charge uses a monitor circuit that uses as a threshold an accumulated trapped charge that is not sufficient to influence operation of the charged semiconductor structure.

10. The method of claim 4, wherein after said removing said central portion of the at least one trench isolation region, the remaining portion of the trench isolation region has a U-shaped geometry.

11. A method for neutralizing a charged semiconductor structure comprising:
 exposing a semiconductor structure to ionizing radiation having an energy that provides for generating a trapped charge within the semiconductor structure; and
 thermally annealing the trapped charge to neutralize the trapped charge, the thermal annealing being undertaken using at least one heater located embedded within at least one isolation region within a semiconductor substrate within the semiconductor structure, wherein the semiconductor structure further comprises redundant components each of which has a separate heater, wherein a quantity of the redundant components is adequate to perform the thermally annealing with at least one redundant component, while remaining redundant components operate.

12. The method of claim 11 wherein the exposing the semiconductor structure to ionizing radiation uses ionizing radiation selected from the group consisting of cosmic radiation, alpha radiation, protons and electrons in trapped particle belts, X-rays and gamma-rays.

13. The method of claim 11 wherein the thermal annealing is undertaken at a temperature of at least about 200° C.

14. The method of claim 11 wherein the exposing the semiconductor structure includes exposing the semiconductor structure to provide a trapped charge within a dielectric layer within the semiconductor structure.

15. The method of claim 11 wherein the thermal annealing the trapped charge comprises thermal annealing after an arbitrary time interval projected for a trapped charge to accumulate, where the trapped charge is insufficient to impact operation of the charged semiconductor structure.

16. The method of claim 11 wherein the thermal annealing the trapped charge uses a monitor circuit that uses as a threshold an accumulated trapped charge that is not sufficient to influence operation of the charged semiconductor structure.

* * * * *